US006573150B1

(12) United States Patent
Urdahl et al.

(10) Patent No.: US 6,573,150 B1
(45) Date of Patent: Jun. 3, 2003

(54) INTEGRATION OF CVD TANTALUM OXIDE WITH TITANIUM NITRIDE AND TANTALUM NITRIDE TO FORM MIM CAPACITORS

(75) Inventors: Randall S. Urdahl, Mountain View, CA (US); Pravin K. Narwankar, Sunnyvale, CA (US); Shankarrram A. Athreya, Sunnyvale, CA (US); Asher K. Sinensky, Berkeley, CA (US); Andrea M. Mendoza, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 3 days.

(21) Appl. No.: 09/686,451

(22) Filed: Oct. 10, 2000

(51) Int. Cl.[7] .............................................. H01L 21/20
(52) U.S. Cl. ....................... 438/396; 438/240; 438/785; 438/907; 438/381
(58) Field of Search ................................ 438/396, 240, 438/785, 907, 660, 957, 909, 790, 771, 402, 404, 239, 241, 243, 381, 585, 251, 775

(56) References Cited

U.S. PATENT DOCUMENTS

| 5,406,447 | A | | 4/1995 | Miyazaki | |
|---|---|---|---|---|---|
| 5,711,816 | A | * | 1/1998 | Kirlin et al. ................. | 118/726 |
| 5,919,522 | A | * | 7/1999 | Baum et al. .............. | 427/248.1 |
| 6,015,917 | A | * | 1/2000 | Bhandari et al. ............. | 556/12 |
| 6,037,003 | A | | 3/2000 | Gordon et al. | |
| 6,177,305 | B1 | * | 1/2001 | Hornback et al. ........... | 438/240 |
| 6,207,561 | B1 | * | 3/2001 | Hwang et al. ............... | 438/660 |
| 6,245,151 | B1 | * | 6/2001 | Bhandari et al. ........... | 118/726 |
| 6,281,142 | B1 | * | 8/2001 | Basceri et al. .............. | 438/771 |
| 6,319,766 | B1 | * | 11/2001 | Bakli et al. .................. | 438/240 |

OTHER PUBLICATIONS

International Written Opinion PCT/US 01/42452.
Chiu, H.T., "Deposition of Tantalum Nitride Thin Films from Ethylimidotantalum Complex", Journal of Material Science Letters, vol. 11, 1992, pp. 96–98.
Tabuchi, T., "Application of Penta–Di–Methyl–AminoTantalum to a Tantalum Source in Chemical Vapor Deposition of Tantalum Oxide Films", Japanese Journal of Applied Physics, vol. 30, No. 11B, 1991, pp. L1974–L1977.

* cited by examiner

*Primary Examiner*—Matthew Smith
*Assistant Examiner*—Igwe U. Anya
(74) *Attorney, Agent, or Firm*—Blakely Sokoloff Taylor & Zafman

(57) ABSTRACT

The present invention provides a method of integrating tantalum oxide into an MIM capacitor for a semiconductor device, comprising the step of vapor-depositing the tantalum oxide from an oxygen-free liquid precursor and under process conditions comprising a deposition temperature of less than about 500° C. and a deposition pressure of less than about 96 Torr, wherein the tantalum oxide is integrated into the MIM capacitor. Also provided is a method of forming an MIM capacitor comprising the step of integrating a tantalum oxide dielectric film with a tantalum nitride or a titanium nitride bottom electrode deposited on a substrate and a titanium nitride top electrode thereby forming an MIM capacitor.

34 Claims, 13 Drawing Sheets

| Anneal Conditions | Cp(fF/mm2) | Teff(Å) |
|---|---|---|
| *325°C* | | |
| 325C/180sec | 17.0 | 20.4 |
| 325C/360sec | 16.6 | 20.8 |
| 325C/600sec | 16.4 | 21.1 |
| *350°C* | | |
| 350C/180sec | 16.6 | 20.7 |
| 350C/600sec | 14.9 | 23.2 |
| *375°C* | | |
| 375C/180sec | 15.3 | 22.5 |
| 375C/360sec | 14.2 | 24.4 |
| 375C/600sec | 14.1 | 24.5 |

| Anneal Conditions | Cp(fF/mm2) | Teff(?) |
|---|---|---|
| 325°C | | |
| 325C/180sec | 28.5 | 12.1 |
| 325C/480sec | 25.0 | 13.8 |
| 325C/600sec | 21.8 | 15.8 |
| 350?C | | |
| 350C/180sec | 24.9 | 13.9 |
| 350C/360sec | 19.5 | 17.7 |
| 350C/480sec | 18.8 | 18.3 |
| 350C/600sec | 15.5 | 22.3 |
| 375?C | | |
| 375C/240sec | 19.7 | 17.5 |
| 375C/480sec | 12.0 | 28.8 |

| Anneal Conditions | Cp(fF/mm2) | Teff(Å) |
|---|---|---|
| *180 sec* | | |
| 325C/180sec | 17.0 | 20.4 |
| 350C/180sec | 16.6 | 20.7 |
| 375C/180sec | 15.3 | 22.5 |
| *360 sec* | | |
| 325C/360sec | 16.6 | 20.8 |
| 375C/360sec | 14.2 | 24.4 |
| *600 sec* | | |
| 325C/600sec | 16.4 | 21.1 |
| 350C/600sec | 14.9 | 23.2 |
| 375C/600sec | 14.1 | 24.5 |

| Anneal Conditions | Cp(fF/mm2) | Teff(A) |
|---|---|---|
| *180 sec* | | |
| 325C/180sec | 28.5 | 12.1 |
| 350C/180sec | 24.9 | 13.9 |
| *480 sec* | | |
| 325C/480sec | 25 | 13.8 |
| 350C/480sec | 18.8 | 18.3 |
| 375C/480sec | 12.0 | 40.3 |
| *600 sec* | | |
| 325C/600sec | 21.8 | 15.8 |
| 350C/600sec | 15.5 | 22.3 |

INTEGRATION OF CVD TANTALUM OXIDE WITH TITANIUM NITRIDE AND TANTALUM NITRIDE TO FORM MIM CAPACITORS

BACKGROUND OF THE INVENTION

1. Field of the Invention

The present invention relates generally to the fields of applied physics and chemical vapor deposition of dielectric films. More specifically, the present invention relates to a method of low temperature integration of a tantalum oxide dielectric film by metalorganic chemical vapor deposition to form thin film metal-insulator-metal (MIM) capacitors.

2. Description of the Related Art

The current trend toward higher density memories in DRAM capacitors, together with the concomitant shrinking of device geometry and decrease in feature size to 0.35 μm or less, precludes the use of conventional dielectrics such as silicon dioxide ($SiO_2$) and silicon nitride ($Si_3N_4$). The low dielectric constants for silicon oxide and silicon nitride indicate the inability of these materials to provide sufficient storage capacitance. The next generation DRAM technology requires much higher dielectric constant materials with low dielectric loss. In addition, these conditions must be met for very thin films, i.e., <100 Å thick, in order to achieve sufficient capacitance density.

State-of-the-art storage capacitors use various high dielectric constant (k) ceramic and ferroelectric films, such as tantalum oxide ($Ta_2O_5$), barium strontium titanate (BST), strontium titanate ($SrTiO_3$), and lead zirconium titanate (PZT). Of these, tantalum oxide (k~25) is emerging as the preferred material for next-generation memory devices. Although barium strontium titanate has a k value of roughly 400, it is more difficult to integrate in devices than tantalum oxide and will likely not be used in production before the year 2005. Of course, tantalum oxide presents its own unique set of materials integration challenges. For example, it can be difficult to control the defect density in as-deposited $Ta_2O_5$ films. This results in high leakage currents and necessitates the subsequent annealing of the film to increase oxygen content and reduce carbon levels.

If the films are being deposited as capacitor dielectrics for DRAM applications, conformal coverage of high aspect ratio structures is generally required; therefore it is advantageous to use a chemical vapor deposition (CVD) process, preferably using a metal-organic precursor. Currently, tantalum oxide films are deposited using tantalum pentaethoxide (TAETO) and oxygen in a metal-organic CVD application. When these thin dielectric films are deposited, variations in composition arising mainly from vacancies at the anionic (oxygen) sites result in characteristically high leakage current densities. Annealing the film in an oxidizing environment serves in part to fill these vacancies and decrease the leakage current density. However, the presence of oxygen in both the deposition and annealing steps can also cause formation of interfacial oxides or oxynitrides between the dielectric and underlying electrode.

An effective dielectric film provides both a low leakage current and high capacitance density. Annealing the deposited $Ta_2O_5$ film in a strong oxidizing environment improves the J-V characteristics, but can decrease the capacitance density due to the growth of parasitic oxides and/or oxynitrides at the dielectric/electrode interface. Additionally, for the common case of a doped polycrystalline silicon electrode, the annealing process typically used in conjunction with $Ta_2O_5$ is a rapid thermal oxidation (RTO) carried out at the relatively high temperature of about 800° C. This particular anneal process results in a $Ta_2O_5$ film with reduced leakage current, when compared to the as-deposited film, but also with a much lower capacitance density. Furthermore, this type of high temperature rapid thermal oxidation cannot be used with some common metal nitride electrodes (e.g. titanium nitride, tantalum nitride), due to their high sensitivity towards oxidation at temperatures greater than about 450° C. Therefore, it is advantageous to integrate a tantalum oxide dielectric film at a low temperature in such a way as to provide both low leakage current and high capacitance densities.

As described in part above, the prior art is deficient in the lack of an effective method for the low-temperature integration of a tantalum oxide dielectric film for MIM capacitors using an oxygen-free liquid precursor in a MOCVD application. The present invention fulfills this long-standing need and desire in the art.

SUMMARY OF THE INVENTION

One embodiment of the present invention provides a method of integrating tantalum oxide into an MIM capacitor for a semiconductor device, comprising the step of vapor-depositing the tantalum oxide from an oxygen-free liquid precursor and under process conditions comprising a deposition temperature of less than about 500° C. and a deposition pressure of less than about 96 Torr, so that the tantalum oxide is integrated into the MIM capacitor.

Another embodiment of the present invention provides a method of integrating tantalum oxide into a MIM capacitor for a semiconductor device, comprising the steps of vapor-depositing the tantalum oxide from an oxygen-free liquid precursor and under process conditions comprising a deposition temperature from about 300° C. to about 500° C. and a deposition pressure from about 0.5 Torr to about 96 Torr; and, annealing the tantalum oxide at a temperature less than about 450° C., such that the tantalum oxide is integrated into the MIM capacitor.

Yet another embodiment of the present invention provides a method of forming an MIM capacitor comprising the step of integrating a tantalum oxide dielectric film with a tantalum nitride or a titanium nitride bottom electrode deposited on a substrate and a tantalum nitride or titanium nitride top electrode thereby forming an MIM capacitor.

Yet another embodiment of the present invention provides a method of forming an MIM capacitor comprising the step of integrating a tantalum oxide dielectric film with a tantalum nitride or a titanium nitride bottom electrode deposited on a substrate and a tantalum nitride or a titanium nitride top electrode; where the tantalum oxide dielectric film is formed by the steps comprising vapor-depositing the tantalum oxide from an oxygen-free liquid precursor and under process conditions comprising a deposition temperature from about 300° C. to about 500° C. and a deposition pressure from about 0.5 Torr to about 96 Torr; and, annealing the tantalum oxide at a temperature less than about 450° C., wherein the integration of the tantalum oxide dielectric film forms an MIM capacitor.

Other and further aspects, features, and advantages of the present invention will be apparent from the following description of the presently preferred embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate preferred embodiments of the invention and therefore are not to be considered limiting in their scope.

DETAILED DESCRIPTION OF THE INVENTION

Figure 1A:
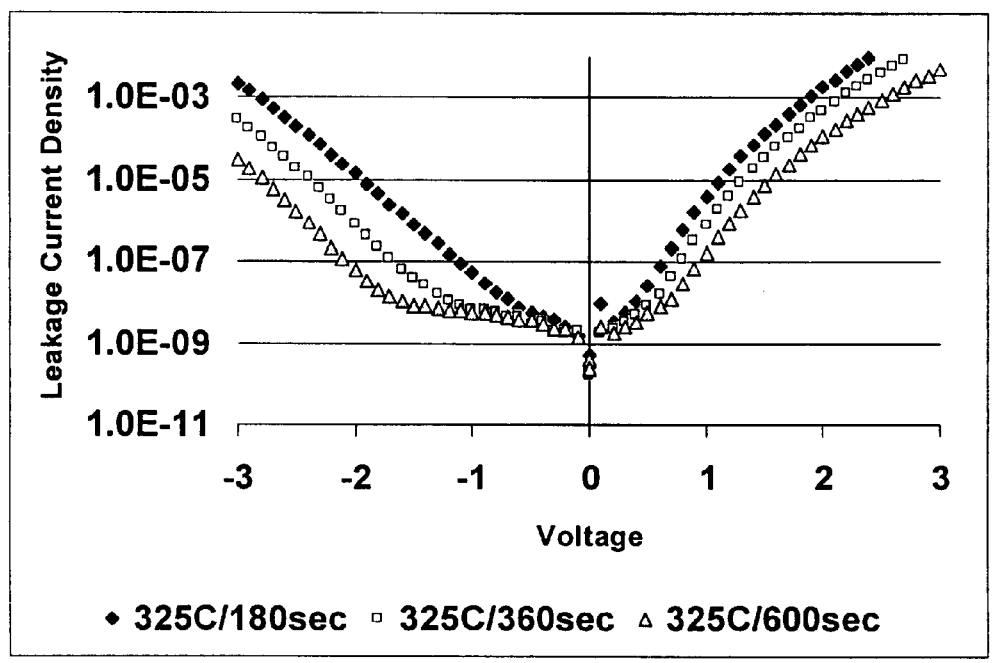
FIG. 1 depicts the effect of time of the annealing process on the J, (leakage current density; A/cm$^2$)-V (applied voltage on top electrode, V) characteristics of an ~120 Å tantalum oxide film on titanium nitride for FIG. 1A: 180/360/600 sec. at 325° C.
FIG. 1B: 180/600 sec. at 350° C.
FIG. 1C: 180/360/600 sec. at 375° C.
FIG. 1D is a summary of the capacitance ($C_p$, fF/$\mu$m$^2$) and the effective oxide thickness ($T_{eff}$, Å) for the various annealing times at specific temperatures. The top electrode is sputtered titanium nitride (TiN).
Figure 1B:
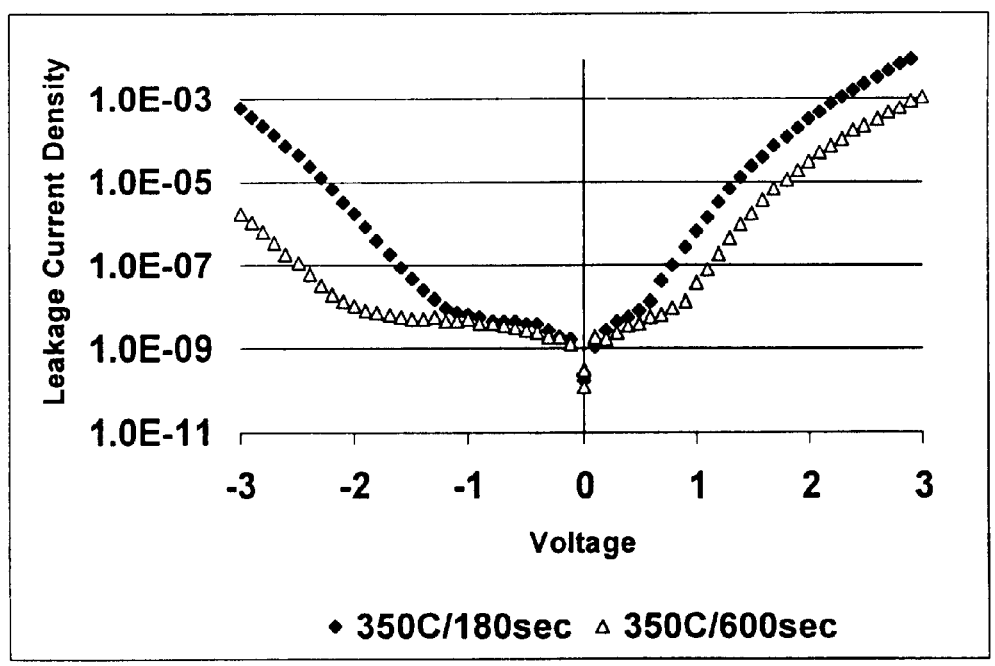
Figures 1C, 1D:
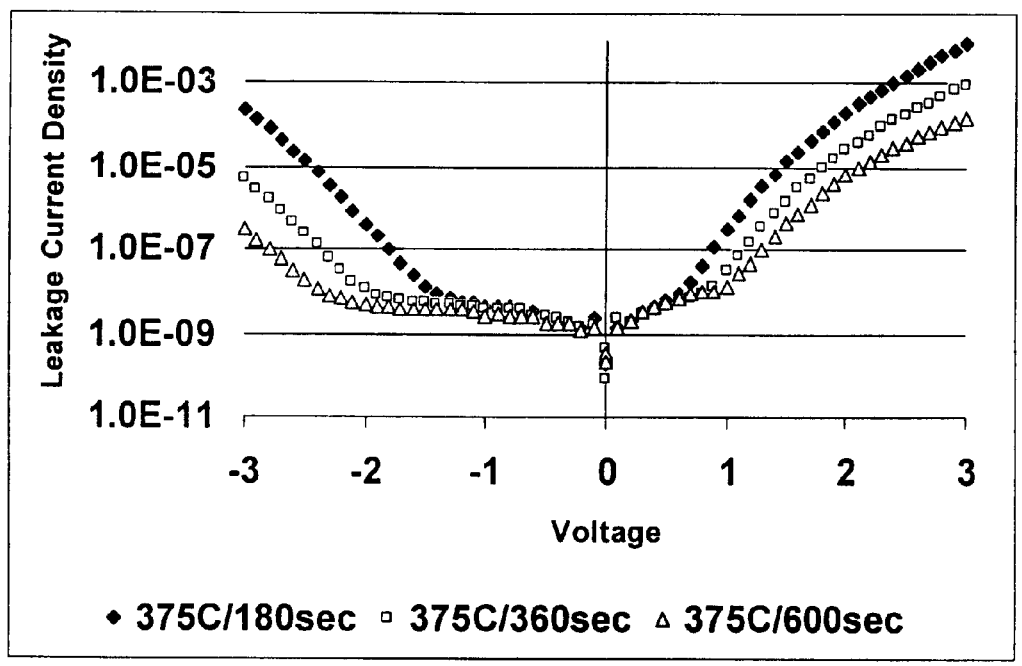
Figure 2A:
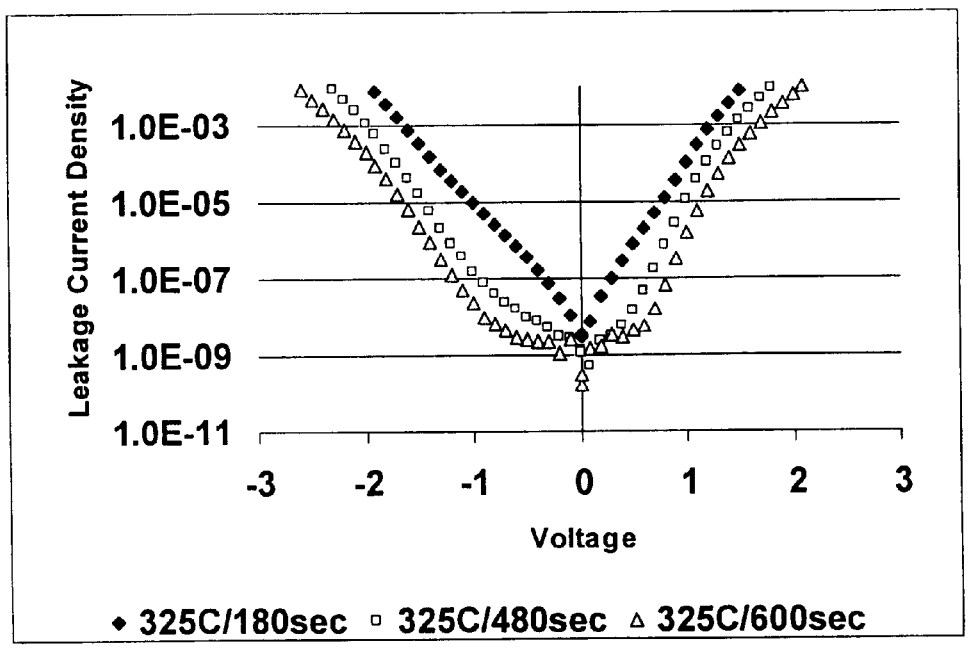
FIG. 2 depicts the effect of time of the annealing process on the J, (leakage current; A/cm$^2$)-V (applied voltage on top electrode, V) characteristics of an ~50 Å tantalum oxide film on titanium nitride for FIG. 2A: 180/480/600 sec. at 325° C.
FIG. 2B: 180/360/480/600 sec. at 350° C.
FIG. 2C: 240/480 sec. at 375° C.
FIG. 2D is a summary of capacitance ($C_p$, fF/$\mu$m$^2$) and the effective oxide thickness ($T_{eff}$, Å) for the various annealing times at specific temperatures. The top electrode is sputtered titanium nitride (TiN).
Figure 2B:
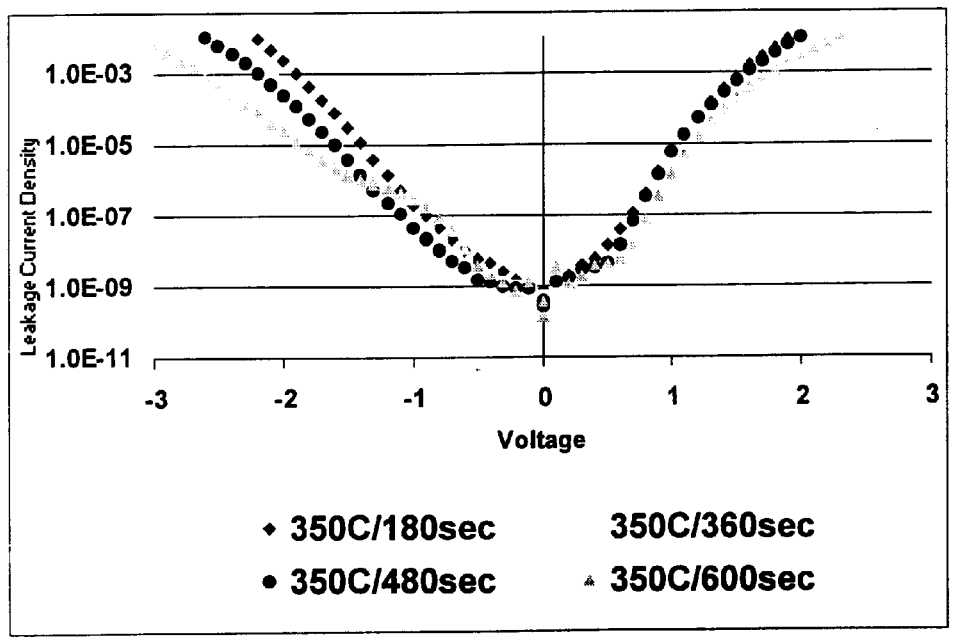
Figures 2C, 2D:
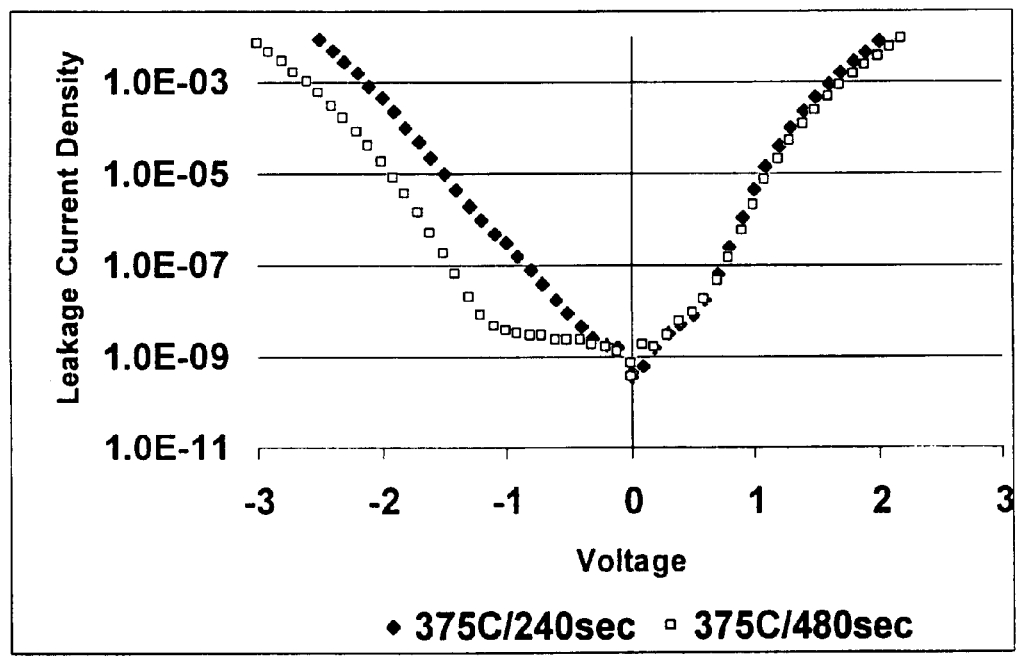

One embodiment of the present invention provides a method of integrating tantalum oxide into an MIM capacitor for a semiconductor device, comprising the step of vapor-depositing the tantalum oxide from an oxygen-free liquid precursor and under process conditions comprising a deposition temperature of less than about 500° C. and a deposition pressure of less than about 96 Torr, wherein the tantalum oxide is integrated into the MIM capacitor. The MIM capacitor has a tantalum nitride or titanium nitride bottom electrode and a tantalum nitride or a titanium nitride top electrode, and furthermore, has a nitrogen-rich stoichiometry at the metal/dielectric interfaces as compared to the bulk of the electrode material to reduce the formation of interfacial oxides and oxy-nitrides during subsequent processing.

The oxygen-free liquid precursor is delivered via direct injection for use in a metalorganic chemical vapor deposition applicaton. A representative example of the oxygen-free liquid precursors is a 70:30 mixture by weight of ethylimino tris(diethylamino)tantalum and ethylimino ethyl(CN) tris (diethylamido)tantalum (EITDET-c). Other examples include ethylimino tris(diethylamino)tantalum (EITDET) and tertiary-butylimino tris(diethylamino)tantalum (TBTDET). Deposition occurs at a temperature of from about 300° C. to about 500° C. and a deposition pressure from about 0.5 Torr to about 96 Torr. Additionally, there is provided a method of annealing the tantalum oxide dielectric film using a remote plasma oxygen source at a temperature of about less than 450° C.

Another embodiment of the present invention provides a method of integrating tantalum oxide into a MIM capacitor for a semiconductor device, comprising the steps of vapor-depositing the tantalum oxide from an oxygen-free liquid precursor and under process conditions comprising a deposition temperature from about 300° C. to about 500° C. and a deposition pressure from about 0.5 Torr to about 96 Torr; and, annealing the tantalum oxide at a temperature less than about 450° C., such that the tantalum oxide is integrated into the MIM capacitor. The electrodes have a nitrogen-rich stoichiometry at the metal/dielectric interfaces as compared to the bulk of the electrode material to reduce the formation of interfacial oxides and oxy-nitrides during subsequent processing. In this embodiment, the oxygen-free liquid precursor is delivered direct injection and is used in a metalorganic chemical vapor deposition applicaton. A representative example of the oxygen-free liquid precursors is a 70:30 mixture by weight of ethylimino tris(diethylamino) tantalum and ethylimino ethyl(CN) tris(diethylamido) tantalum (EITDET-c). Other examples include ethylimino tris(diethylamino)tantalum (EITDET) and tertiary-butylimino tris(diethylamino)tantalum (TBTDET). In addition, annealing of the dielectric film uses a remote plasma source with an oxygen-rich gas mixture.

Yet another embodiment of the present invention provides a method of forming an MIM capacitor comprising the step of integrating a tantalum oxide dielectric film with a tantalum nitride or a titanium nitride bottom electrode deposited on a substrate and a tantalum nitride or a titanium nitride top electrode thereby forming an MIM capacitor. The electrodes have a nitrogen-rich stoichiometry at the metal/dielectric interfaces as compared to the bulk of the electrode material to reduce the formation of interfacial oxides and oxy-nitrides during subsequent processing. The tantalum oxide dielectric film is formed by vapor-deposition from an oxygen-free liquid precursor and under process conditions comprising a deposition temperature of less than about 500° C. and a deposition pressure of less than about 96 Torr. Furthermore, the oxygen-free liquid precursor is delivered via direct injection for use in a metalorganic chemical vapor deposition applicaton. A representative example of the oxygen-free liquid precursors is a 70:30 mixture by weight of ethylimino tris(diethylamino)tantalum and ethylimino ethyl(CN) tris(diethylamido)tantalum (EITDET-c). Other examples include ethylimino tris(diethylamino)tantalum (EITDET) and tertiary-butylimino tris(diethylamino)tantalum (TBTDET). Deposition occurs at a temperature of from about 300° C. to about 500° C. and an deposition pressure from about 0.5 Torr to about 96 Torr. Additionally, there is provided a method of annealing the tantalum oxide dielectric film using a remote plasma oxidation source at a temperature of about less than 450° C.

Yet another embodiment of the present invention provides a method of forming an MIM capacitor comprising the step of integrating a tantalum oxide dielectric film with a tantalum nitride or a titanium nitride bottom electrode deposited on a substrate and a tantalum nitride or a titanium nitride top electrode; where the tantalum oxide dielectric film is formed by the steps comprising vapor-depositing the tantalum oxide from an oxygen-free liquid precursor and under process conditions comprising a deposition temperature from about 300° C. to about 500° C. and a deposition pressure from about 0.5 Torr to about 96 Torr; and, annealing the tantalum oxide at a temperature less than about 450° C., wherein the integration of the tantalum oxide dielectric film forms an MIM capacitor. The electrodes have a nitrogen-rich stoichiometry at the metal/dielectric interfaces as compared to the bulk of the electrode material to reduce the formation of interfacial oxides and oxy-nitrides during subsequent processing. The oxygen-free liquid precursor is delivered by direct injection and is used in a metalorganic chemical vapor deposition applicaton. A representative example of the oxygen-free liquid precursors is a 70:30 mixture by weight of ethylimino tris(diethylamino)tantalum and ethylimino ethyl(CN) tris(diethylamido)tantalum (EITDET-c). Other examples include ethylimino tris(diethylamino)tantalum (EITDET) and tertiary-butylimino tris(diethylamino) tantalum (TBTDET). Furthermore, annealing of the dielectric film uses a remote plasma oxidation source with an oxygen-rich gas mixture.

A tantalum oxide dielectric film has a dielectric constant large enough, i.e. k>20, to be used in high-density DRAM devices. However, deposition normally requires conditions that are also conducive to the formation of parasitic oxide layers at the interfaces between the dielectric layer and the top and bottom electrodes. These parasitic oxide or oxy-nitride layers, while enhancing electrical performance via lowering the leakage current density, reduce the effective capacitance of the device. For the formation of tantalum oxide-based thin-film capacitors using titanium nitride (TiN) and tantalum nitride (TaN) electrodes, an optimal integration scheme requires the reduction or elimination of the interfacial oxides or oxynitrides.

The metal-insulator-metal (MIM) type structures have electrodes that are deposited with a more nitrogen-rich stoichiometry at the electrode/dielectric interface than in the bulk. This approach serves to reduce oxidation of the electrode at the interfacial region during subsequent processing steps. In addition, the tantalum oxide dielectric is deposited using a n oxygen-free precursor and annealed below 450° C. to minimize the formation of such interfacial oxides or oxy-nitrides. Capacitance density and leakage current performance for planar test capacitors measured over a range of experimental conditions that include tantalum oxide dielectric thickness and anneal time/temperature supports this low temperature method to forming thin-film capacitors using tantalum oxide dielectrics.

The following examples are given for the purpose of illustrating various embodiments of the invention and are not meant to limit the present invention in any fashion.

EXAMPLE 1
Effect of Annealing Time on Leakage Current Density

FIGS. 1A–1D demonstrate that the length of annealing time for an ~120 Å tantalum oxide dielectric film primarily affects the leakage current density of the capacitor, while producing only a small (i.e. <15%) change in the capacitance density ($C_p$) or $T_{eff}$. For a given anneal temperature; i.e., 325° C., 350° C. or 375° C., the leakage current density drops by roughly a factor of 100 as the time increases from 180 to 600 seconds. However, as annealing time increases, the $T_{eff}$ only increases slightly with a concomitant drop in capacitance density. The $T_{eff}$ value for a film annealed for 180 seconds at 325° C. is 20.4 Å, whereas a 600 second anneal at the same temperature gives a $T_{eff}$ of 21.1 Å. Therefore increasing the anneal time from 180 to 600 seconds at constant temperature, i.e., 325° C. results in a ~80x decrease in leakage current density at +1V and a <5% increase in $T_{eff}$. The primary effect of increasing the annealing time under these conditions is thus a lowering of the leakage current density. Similar results are observed at 350° C. and 375° C.

In FIGS. 2A–2D, an ~50 Å tantalum oxide dielectric film, deposited under the same conditions as those used for the ~120 Å film, demonstrates even more dramatic effects on the leakage current and capacitance densities as the length of annealing time increases at constant temperature. Since an ~50 Å tantalum oxide film presents even less of a barrier to electrode oxidation than does an ~120 Å film, the value of $T_{eff}$ can undergo large changes as the exposure time in an oxidizing environment, i.e., annealing time) increases. As the annealing time increases from 180 seconds to 600 seconds at 325° C., there is an ~100x decrease in J at +1V and an ~30% increase in $T_{eff}$. At 350° C., an ~10x decrease in J at +1V and an ~60% increase in $T_{eff}$ is observed as the annealing time changes over the same range. Raising the annealing temperature to 375° C., a significant departure from the previous trends is seen. In this case, as the annealing time increases from 240 seconds to 480 seconds, the J-value at +1V remains essentially constant, although $T_{eff}$ increases ~65% from 17.5 Å to 28.8 Å. The data suggest that as the temperature increases from 325° C. to 375° C., an unidentified parasitic dielectric film, probably an oxynitride, is growing at the TiN/$Ta_2O_5$ interface. This film appears to contain many defects, as the increasing dielectric thickness ($T_{eff}$) does not correspond to significantly reduced values of J for T>325° C.

EXAMPLE 2
Effect of Annealing Temperature on Leakage Current Density

Figure 3A:
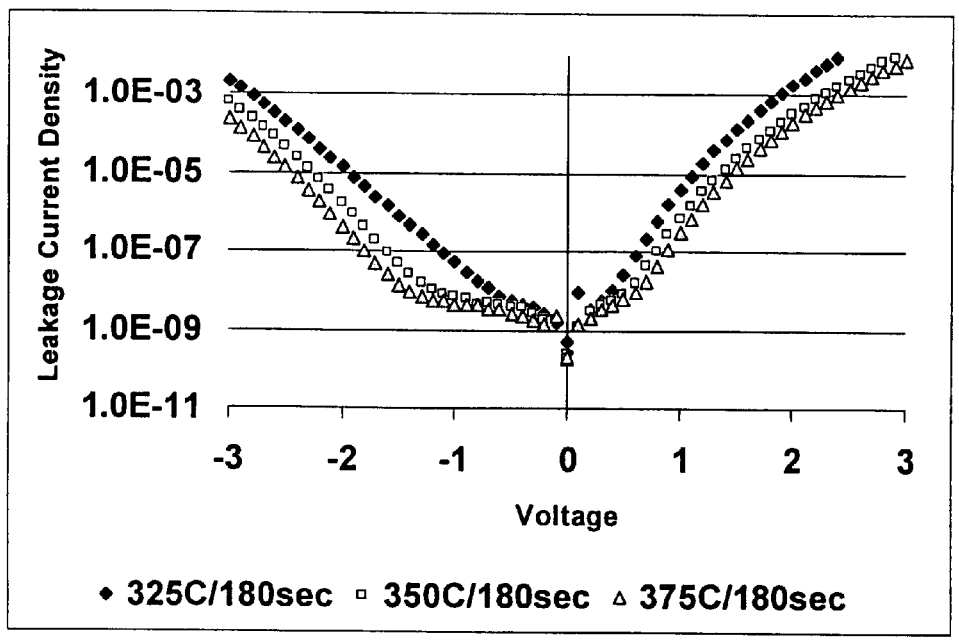
FIG. 3 depicts the effect of temperature of the annealing process on the J, (leakage current; A/cm$^2$)-V (applied voltage on top electrode, V) characteristics of an ~120 Å tantalum oxide film on titanium nitride for FIG. 3A: 325/350/375° C. for 180 sec.
FIG. 3B: 325/375° C. for 360 sec.
FIG. 3C: 325/350/375° C. for 600 seconds.
FIG. 3D is a summary of capacitance density ($C_p$, fF/$\mu$m$^2$) and the effective oxide thickness ($T_{eff}$, Å) for the various annealing temperatures at specific times. The top electrode is sputtered titanium nitride (TiN).
Figure 3B:
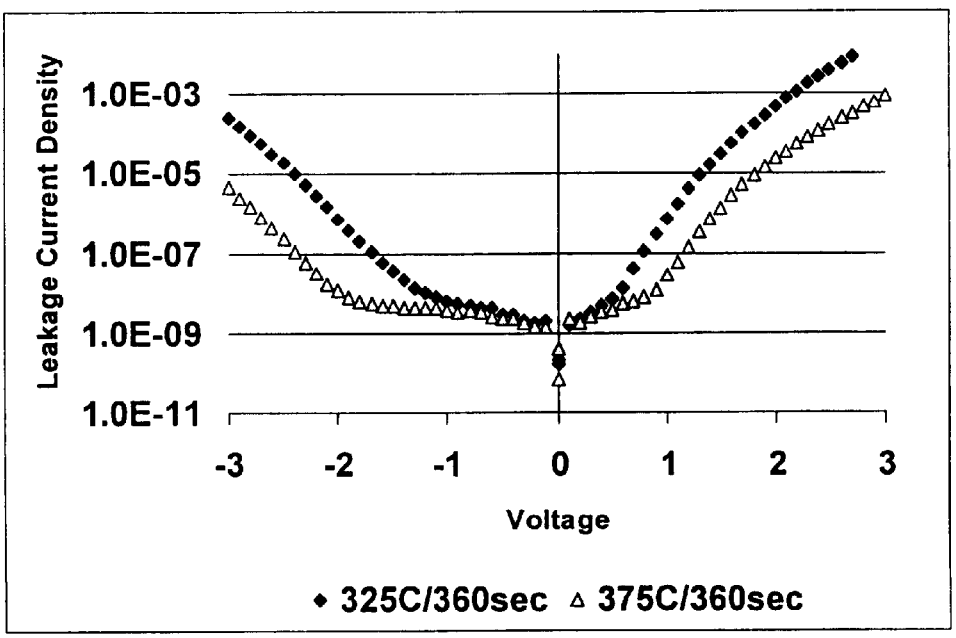
Figures 3C, 3D:
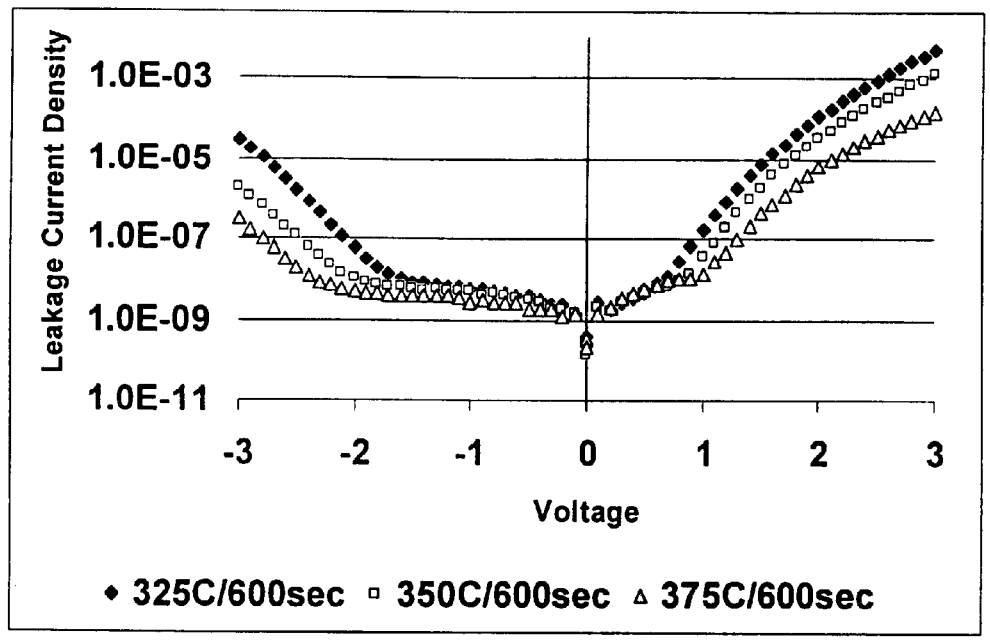
Figure 4A:
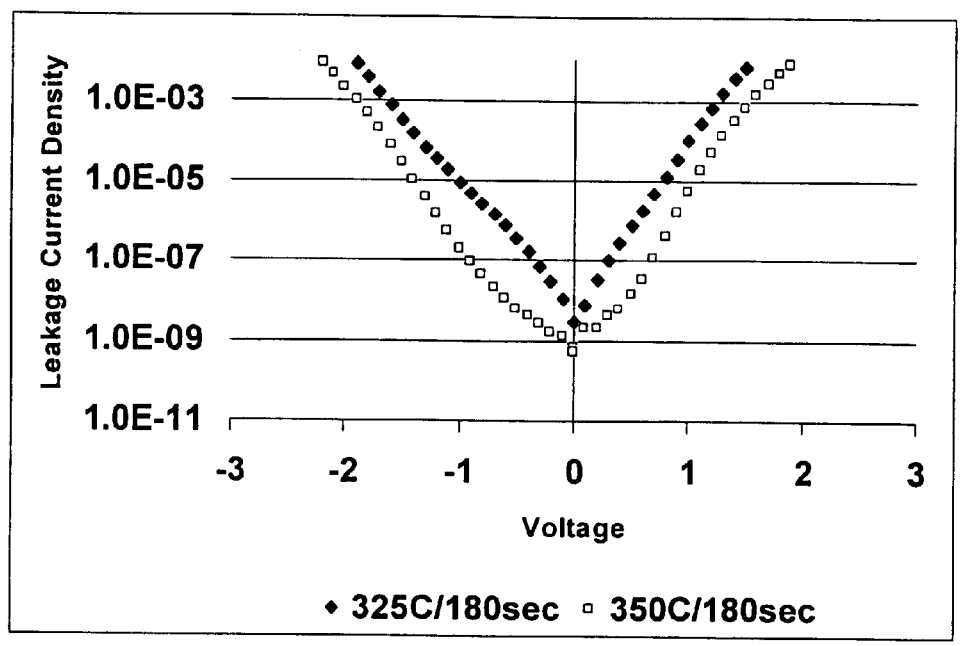
FIG. 4 depicts the effect of temperature of the annealing process on the J, (leakage current; A/cm$^2$)-V (applied voltage on top electrode, V) characteristics of an ~50 Å tantalum oxide film on titanium nitride for FIG. 4A: 325/350° C. for 180 sec.
FIG. 4B: 325/350/375° C. for 480 sec.
FIG. 4C: 325/350° C. for 600 seconds.
FIG. 4D is a summary of capacitance ($C_p$, fF/$\mu$m$^2$) and the effective oxide thickness ($T_{eff}$, Å) for the various annealing temperatures at specific times. The top electrode is sputtered titanium nitride (TiN).
Figure 4B:
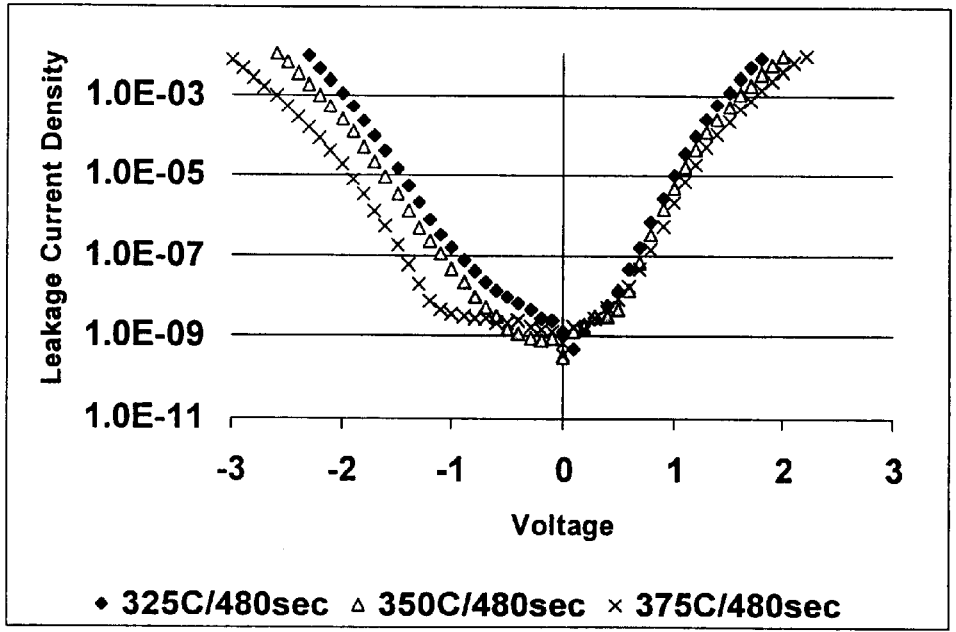
Figures 4C, 4D:
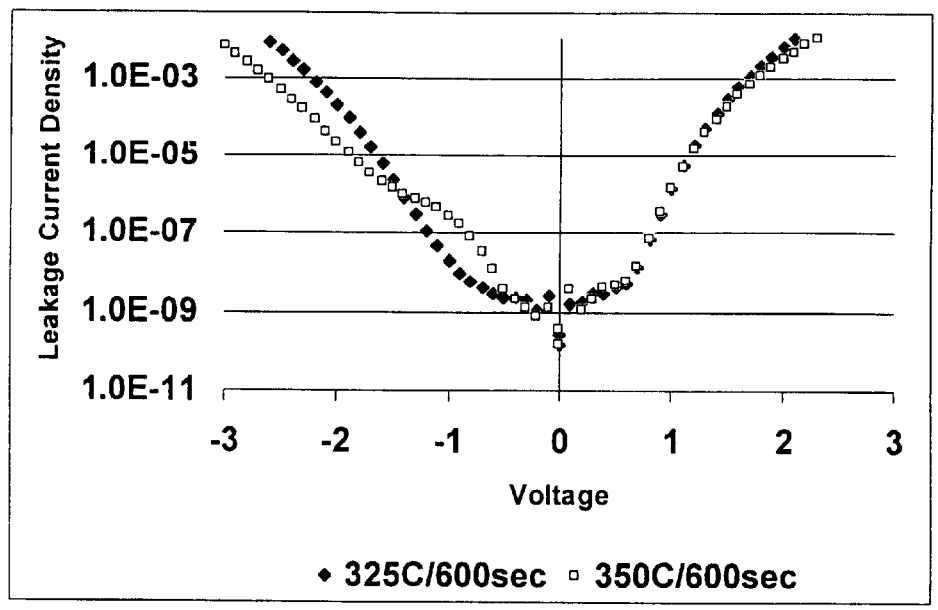

FIGS. 3A–3D illustrate the above results from the aspect of varying the annealing temperature at constant time for an ~120 Å tantalum oxide dielectric film. An increase in this process condition, i.e., temperature results in an ~50–100x reduction of J for all annealing times studied. Again, as with variations in annealing time, as annealing temperature increases, the $T_{eff}$ also increases from ~10–15% with a concomitant drop in capacitance density for any one particular annealing time. The values are the same as in Example 1. FIG. 3D clearly demonstrates that lower annealing temperatures and shorter annealing times yield higher $C_p$ and lower $T_{eff}$ values for a tantalum oxide capacitor with TiN electrodes.

FIGS. 4A–4D further emphasize the advantages of a low temperature/short time annealing process for tantalum oxide films, especially for dielectrics as thin as ~50 Å. Note that the annealing conditions are essentially tunable, i.e., a 180 sec. anneal at 350° C. yields a $C_p$ and $T_{eff}$ comparable to a 480 sec. anneal at 325° C. However, it is generally advantageous to choose the lowest annealing temperature and shortest annealing time to achieve the desired leakage current density, as these conditions also tend to provide the lowest $T_{eff}$ value for the dielectric film.

Figure 5:
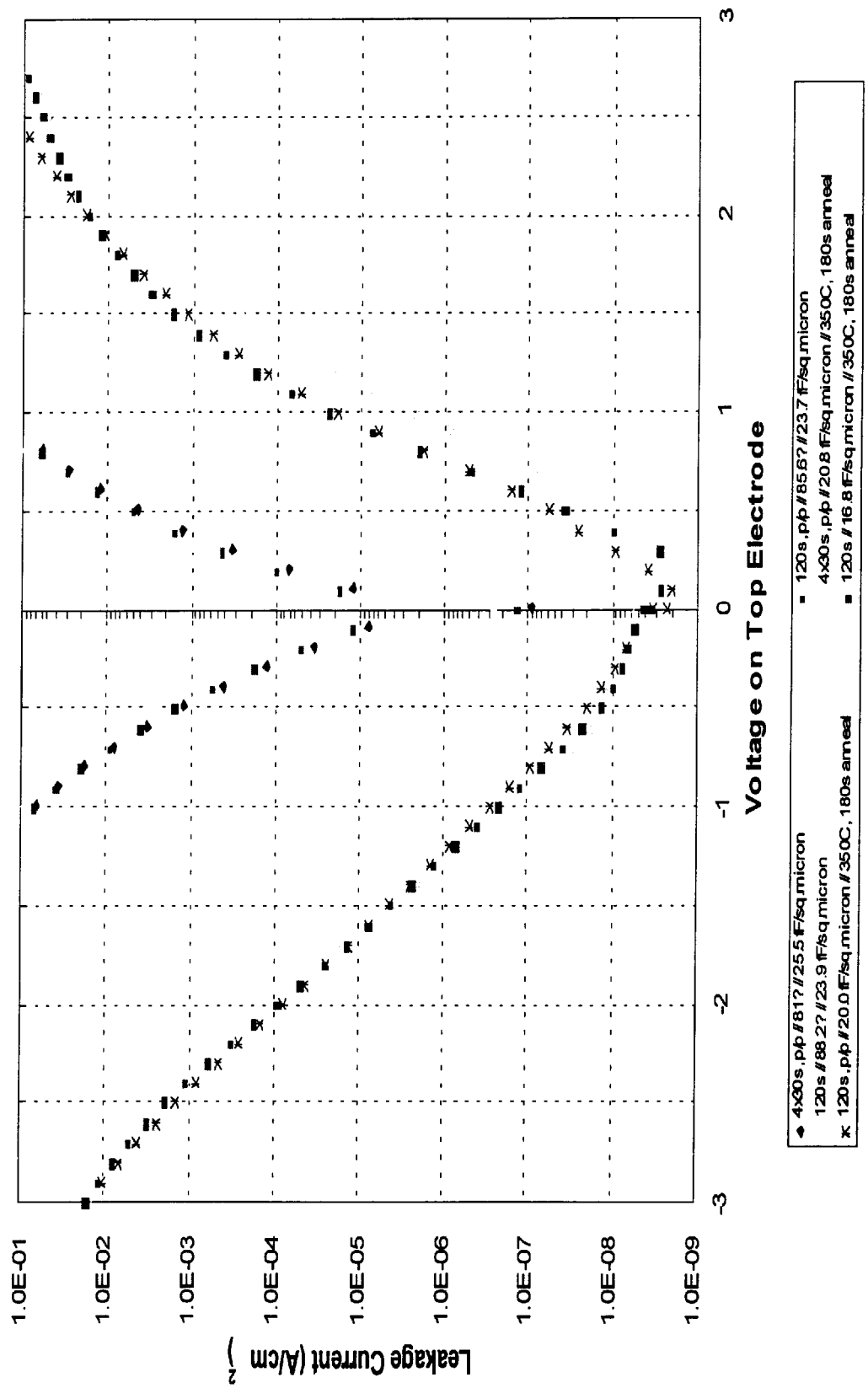
FIG. 5 depicts the effects of process conditions on J-V and $C_p$ for as-deposited and annealed tantalum oxide films deposited using TBTDET as the oxygen-free liquid precursor. The top electrode is sputtered titanium nitride (TiN).

EXAMPLE 3
Comparison of J-V and $C_p$ for as-desposited and Annealed Tantalum Oxide Films FIG. 5 demonstrates that by changing the process conditions used to deposit a tantalum oxide film, it is possible to modify the electrical performance of both the as-deposited and annealed films. The purpose of this experiment was to determine the effects, if any, of depositing a tantalum oxide dielectric film in several "thin" layers versus a single "thick" layer. In addition, the value of using a delay time between the deposition of each "thin" layer was simultaneously evaluated.

Three different process conditions were studied: 1) Film deposition in four 30 sec. steps (i.e. 4 x 30s). The silicon wafer resides in an oxygen ambient at process temperature for 60 sec. before deposition begins, i.e., pre-soak step and for 60 sec. after deposition ends, i.e., post-soak step. Additionally, the wafer is exposed to an oxygen ambient at process temperature for 60 sec. between each of the 30 sec. deposition steps. Thus the designation "4 x 30s, p/p" means that the deposition was carried out in four 30 sec. steps (60 sec. oxygen soak between each step), and includes a 60 sec. pre-soak and post-soak. 2) The designation "120s, p/p" means that the deposition was carried out in a single 120 sec. step, and includes a 60 sec. pre-soak and post-soak. 3) The designation "120s" means that the deposition was performed in a single 120 sec. step with no added oxygen soaks. In the case of the as-deposited films, the data shows clearly that the "4 x 30s, p/p" process condition deposits a film that has ~3 times lower leakage current density at +0.5V than does the "120s" process condition. The physical thickness of the films, measured using ellipsometry, shows that the "4 x 30s, p/p" film is 7.2 Å thinner than the film grown using the "120s" process. This is likely the source of the difference between the measured capacitance density values. After these same films are annealed in a plasma-generated oxidizing environment, the aforementioned differences in electrical performance become even more pronounced. The "4 x 30s, p/p" film now exhibits ~10 times lower leakage current density at +1V and an ~25% capacitance density enhancement compared to the film grown using the "120s" process condition. Remembering that both of these films have been exposed to a total of 120 seconds of $Ta_2O_5$ deposition, the dramatic difference in electrical properties must be due to microscopic compositional variations in the films introduced during processing. Hence this data highlights an ability to tailor the process conditions to achieve the desired film performance.

Figure 6A:
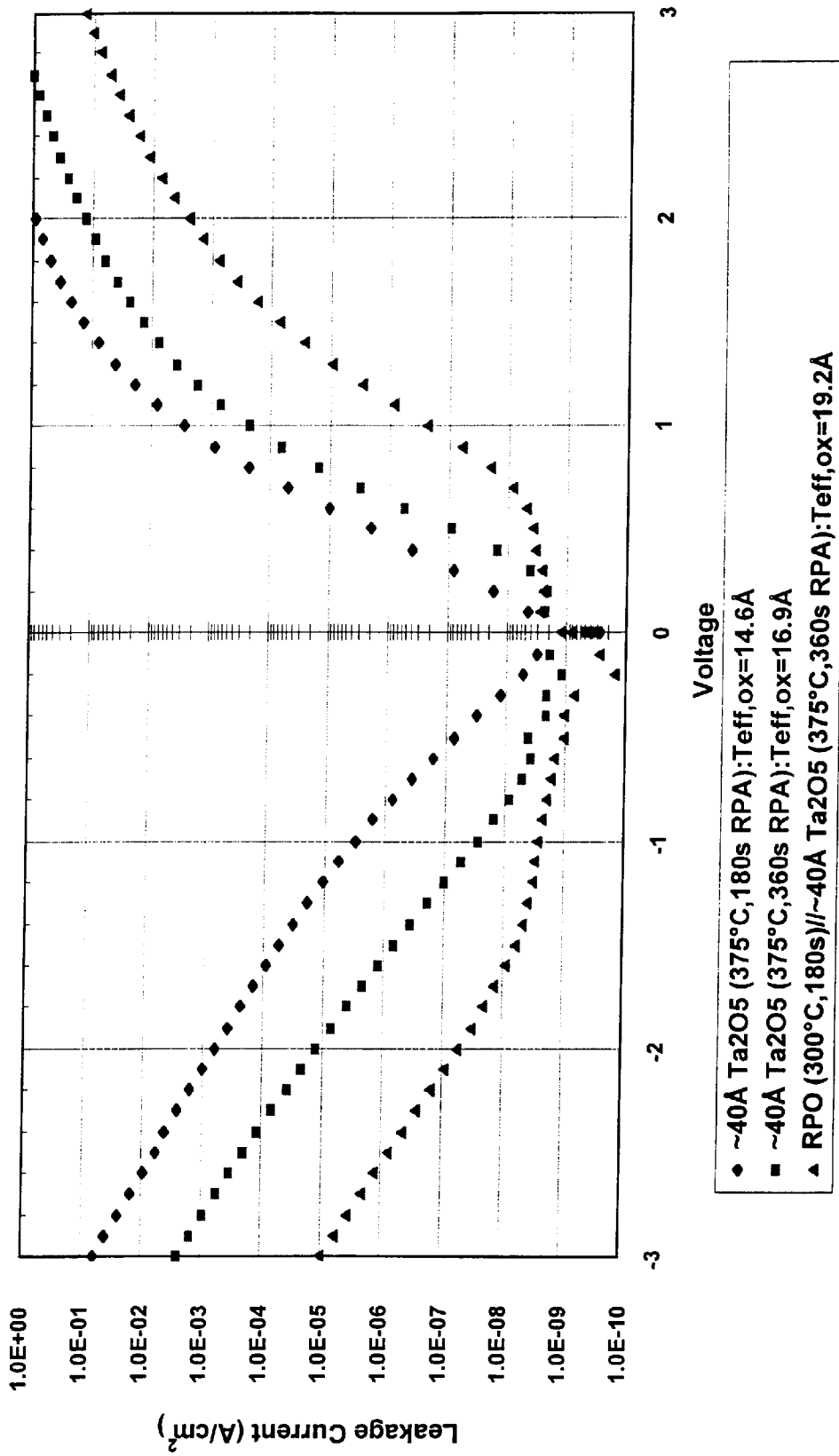
FIG. 6 depicts the J-V and $C_p$ results for tantalum oxide films on tantalum nitride, with titanium nitride as the top electrode, deposited using EITDET-c as the oxygen-free liquid precursor and annealed by remote plasma oxidation, for a 40 Å tantalum oxide film (FIG. 6A), a 60 Å tantalum oxide film (FIG. 6B) and a 120 Å tantalum oxide film (FIG. 6C).
Figure 6B:
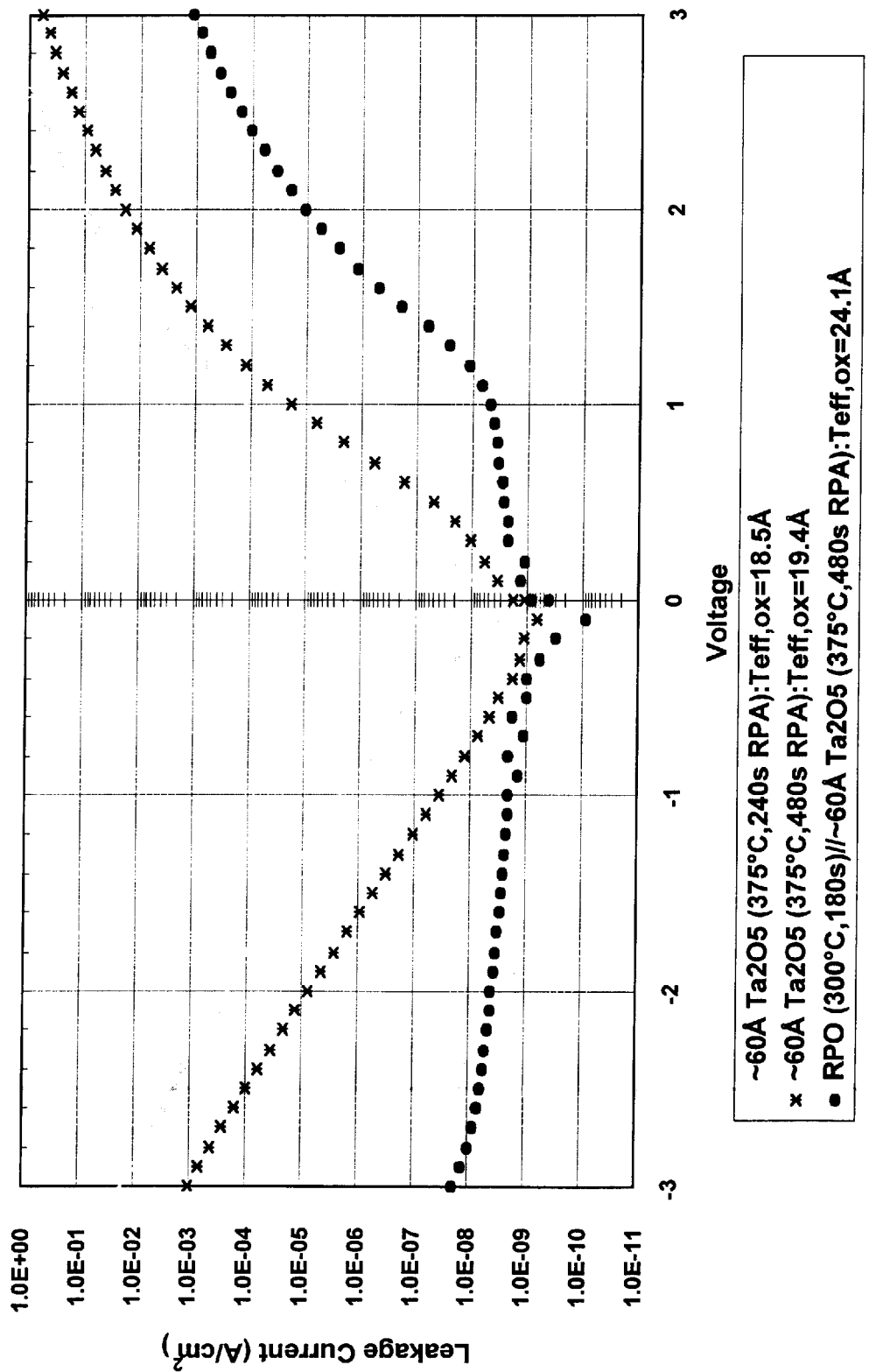
Figure 6C:
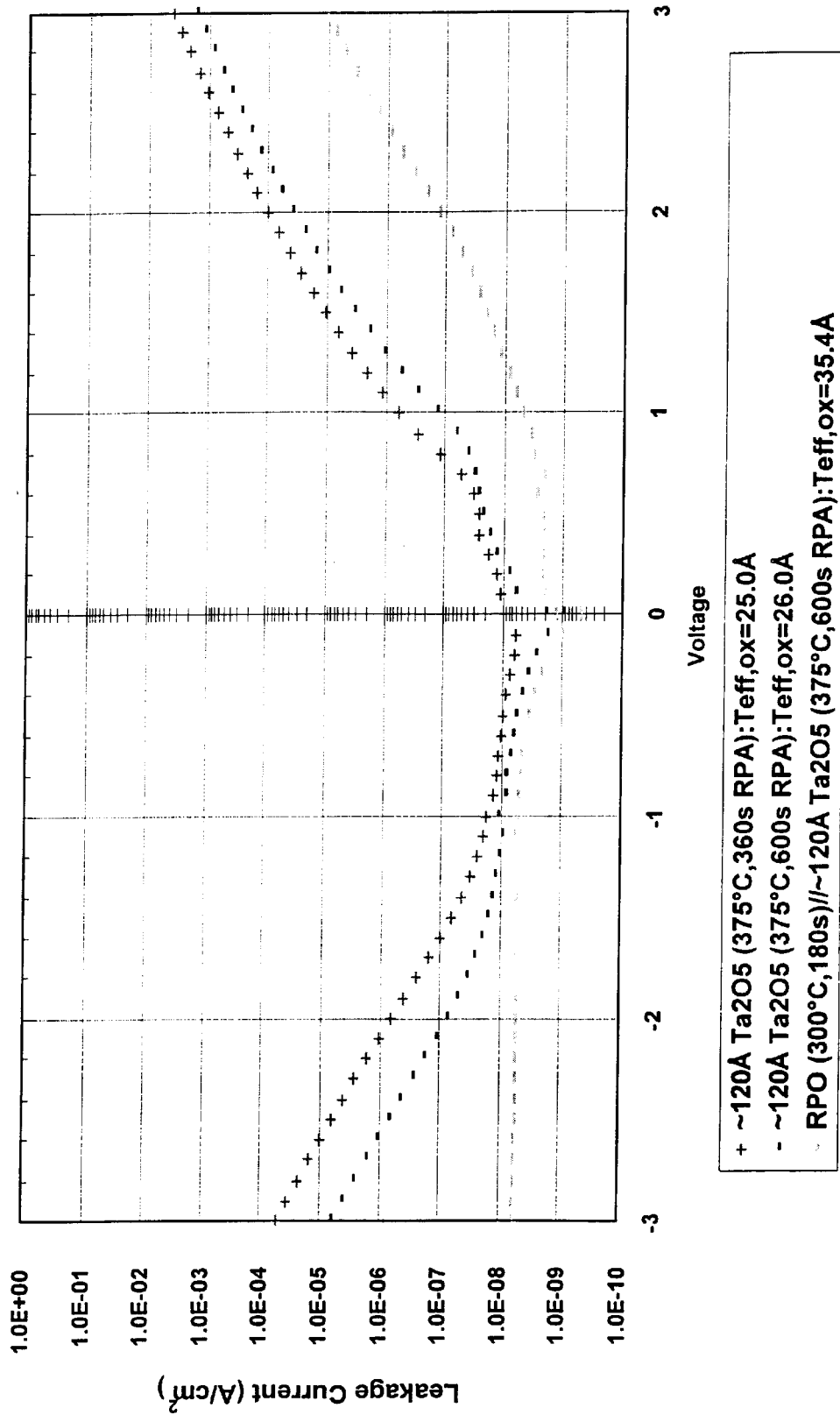

EXAMPLE 4
Effect of Dielectric Thickness and Annealing Conditions on J-V and $C_p$ Performance for Tantalum Oxide Films on Tantalum Nitride Bottom Electrodes FIGS. 6A–6C compare the J-V and $C_p$ results for 40 Å, 60 Å, and 120 Å tantalum oxide dielectric films. These films are grown using EITDET-c as the precursor and are deposited on tantalum nitride bottom electrodes with titanium nitride top electrodes. For each specific dielectric film thickness, the film was annealed at 375° C. for differing times by performing a remote plasma anneal (RPA). Additionally, a remote plasma oxidation (RPO) was performed on one of the three tantalum nitride substrates used in each set of experiments.

As expected, the increase in annealing time (RPA) lowers J and increases $T_{eff}$, i.e., decreases the capacitance density, within each individual film thickness. The addition of a RPO step is expected to provide some initial oxidation of the bottom electrode, i.e., form a stable tantalum oxy-nitride dielectric layer at the surface. The data supports this assertion, as the J values, e.g., at +1V, for each of the tantalum oxide films, i.e., 40 Å, 60 Å, and 120 Å, on pre-oxidized tantalum nitride are nominally 10–1000x lower than for the films deposited on untreated bottom electrodes. It is also seen that pre-oxidation of the bottom electrode tends to increase the overall value of $T_{eff}$ for the capacitor relative to the case of no pre-treatment (i.e. formation of an initial interfacial tantalum oxy-nitride adds directly to the total dielectric thickness).

Figure 7:
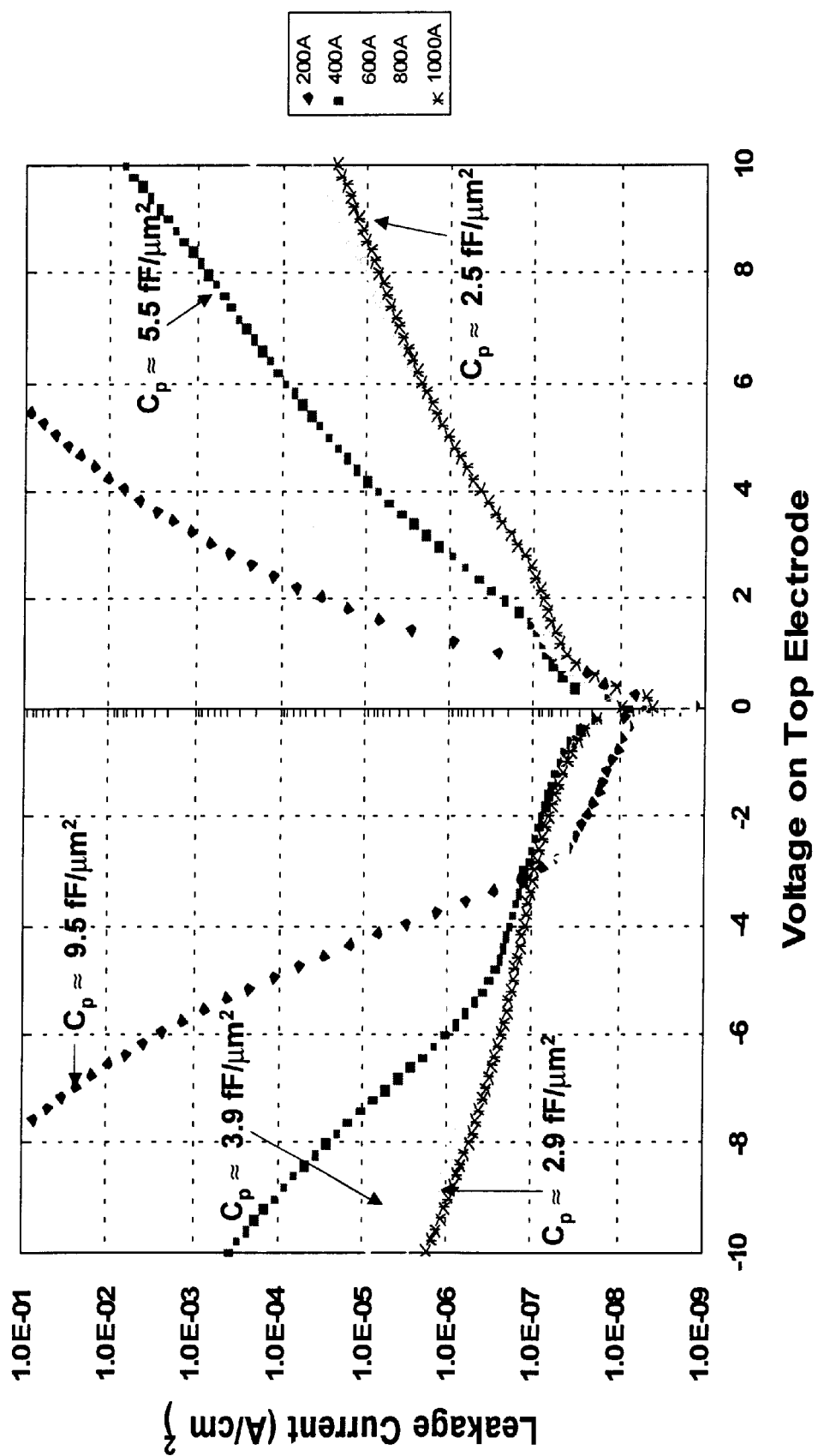
FIG. 7 depicts the J-V and $C_p$ results for 200–1000 Å tantalum oxide films with titanium nitride electrodes and deposited using TBTDET as the oxygen-free liquid precursor.

EXAMPLE 5
Summary: Effect of Tantalum Oxide Film Thickness on J-V and $C_p$ Results FIG. 7 depicts the J-V and $C_p$ values for tantalum oxide capacitors with titanium nitride electrodes and dielectric film thicknesses of 200 Å, 400 Å, 600 Å, 800 Å, and 1000 Å. The tantalum oxide film was deposited using TBTDET as the liquid precursor. This graph demonstrates that as the dielectric film thickness increases, the leakage current density tends to decrease, and the capacitance density scales inversely with thickness. Table 1 summarizes the data.

TABLE 1

Capacitance density as a function of dielectric film thickness

| $Ta_2O_5$ film thickness (Å) | Capacitance density ($C_p$) (fF/$\mu m^2$) |
|---|---|
| 200 | 9.5 |
| 400 | 5.5 |
| 600 | 3.9 |
| 800 | 2.9 |
| 1000 | 2.5 |

Any patents or publications mentioned in this specification are indicative of the levels of those skilled in the art to which the invention pertains. These patents and publications are herein incorporated by reference to the same extent as if each individual publication was specifically and individually indicated to be incorporated by reference.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A method of integrating tantalum oxide into an MIM capacitor for a semiconductor device, comprising the step of:
   vapor-depositing the tantalum oxide from an oxygen-free liquid precursor and under process conditions comprising a deposition temperature of less than about 500° C. and a deposition pressure of less than about 96 Torr, wherein the tantalum oxide is integrated into a MIM capacitor.

2. The method of claim 1, wherein the MIM capacitor comprises a tantalum nitride or titanium nitride bottom electrode deposited on a substrate and a tantalum nitride or a titanium nitride top electrode.

3. The method of claim 2, wherein the electrodes have a nitrogen-rich stoichiometry at a dielectric interface with the tantalum oxide dielectric film relative to the stoichiometry of the bulk electrode material such that oxidation of the electrodes at the dielectric interface during subsequent processing is reduced.

4. The method of claim 1, wherein the oxygen-free liquid precursor is delivered by direct injection for use during a metalorganic chemical vapor deposition application.

5. The method of claim 1, wherein the deposition temperature is from about 300° C. to about 500° C.

6. The method of claim 1, wherein the deposition pressure is from about 0.5 Torr to about 96 Torr.

7. The method of claim 1, wherein the oxygen-free liquid precursor is a 70:30 mixture by weight of ethylimino tris(diethylamino)tantalum and ethylimino ethyl(CN) tris(diethylamido)tantalum.

8. The method of claim 1, wherein the oxygen-free liquid precursor is selected from the group consisting of ethylimino tris(diethylamino)tantalum and tertiary-butylimino tris(diethylamino)tantalum.

9. The method of claim 1, further comprising the step of: annealing the tantalum oxide dielectric film.

10. The method of claim 9, wherein said annealing occurs at a temperature less than about 450° C.

11. The method of claim 9, wherein said annealing uses a remote plasma source with an oxygen-rich gas mixture.

12. A method of integrating tantalum oxide into a MIM capacitor for a semiconductor device, comprising the steps of:
vapor-depositing the tantalum oxide from an oxygen-free liquid precursor and under process conditions comprising a deposition temperature from about 300° C. to about 500° C. and a deposition pressure from about 0.5 Torr to about 96 Torr; and,
annealing the tantalum oxide at a temperature less than about 450° C.,
wherein the tantalum oxide is integrated into the MIM capacitor.

13. The method of claim 12, wherein the oxygen-free liquid precursor is delivered by direct injection for use during a metalorganic chemical vapor deposition application.

14. The method of claim 12, wherein the MIM capacitor comprises a tantalum nitride or a titanium nitride bottom electrode deposited on a substrate and a tantalum nitride or a titanium nitride top electrode.

15. The method of claim 14, wherein the electrodes have a nitrogen-rich stoichiometry at a dielectric interface with the tantalum oxide dielectric film relative to the stoichiometry of the bulk electrode material such that oxidation of the electrodes at the dielectric interface during subsequent processing is reduced.

16. The method of claim 12, wherein the oxygen-free liquid precursor is a 70:30 mixture by weight of ethylimino tris(diethylamino)tantalum and ethylimino ethyl(CN) tris(diethylamido)tantalum.

17. The method of claim 12, wherein the oxygen-free liquid precursor is selected from the group consisting of ethylimino tris(diethylamino)tantalum and tertiary-butylimino tris(diethylamino)tantalum.

18. The method of claim 12, wherein said annealing uses a remote plasma source with an oxygen-rich gas mixture.

19. A method of forming an MIM capacitor comprising the step of:
integrating a tantalum oxide dielectric film with a tantalum nitride or a titanium nitride bottom electrode deposited on a substrate and a tantalum nitride or a titanium nitride top electrode thereby forming an MIM capacitor wherein the electrodes have a nitrogen-rich stoichiometry at the interface with the tantalum oxide dielectric film relative to the stoichiometry of the bulk electrode material such that oxidation of the electrodes at the dielectric interface during subsequent processing is reduced.

20. A method of forming an MIM capacitor comprising the step of:
integrating a tantalum oxide dielectric film with a tantalum nitride or a titanium nitride bottom electrode deposited on a substrate and a tantalum nitride or a titanium nitride top electrode thereby forming an MIM capacitor wherein said tantalum oxide dielectric film is formed by a method comprising:
vapor-depositing the tantalum oxide dielectric film from an oxygen-free liquid precursor under process conditions comprising a deposition temperature of less than about 500° C. and a deposition pressure of less than about 96 Torr, thereby forming said tantalum oxide dielectric film.

21. The method of claim 20, wherein the oxygen-free liquid precursor is delivered by direct injection for use during a metalorganic chemical vapor deposition application.

22. The method of claim 20, wherein the deposition temperature is from about 300° C. to about 500° C.

23. The method of claim 20, wherein the deposition pressure is from about 0.5 Torr to about 96 Torr.

24. The method of claim 20, wherein the oxygen-free liquid precursor is a 70:30 mixture by weight of ethylimino tris(diethylamino)tantalum and ethylimino ethyl(CN) tris(diethylamido)tantalum.

25. The method of claim 20, wherein the oxygen-free liquid precursor is selected from the group consisting of ethylimino tris(diethylamino)tantalum and tertiary-butylimino tris(diethylamino)tantalum.

26. The method of claim 20, further comprising the step of:
annealing the tantalum oxide dielectric film.

27. The method of claim 26, wherein said annealing occurs at a temperature of less than about 450° C.

28. The method of claim 26, wherein said annealing uses a remote plasma source with an oxygen-rich gas mixture.

29. A method of forming an MIM capacitor comprising the steps of:
integrating a tantalum oxide dielectric film with a tantalum nitride or a titanium nitride bottom electrode deposited on a substrate and a tantalum nitride or titanium nitride top electrode;
wherein the tantalum oxide dielectric film is formed by the steps comprising:
vapor-depositing the tantalum oxide from an oxygen-free liquid precursor and under process conditions comprising a deposition temperature from about 300° C. to about 500° C. and a deposition pressure from about 0.5 Torr to about 96 Torr; and,
annealing the tantalum oxide at a temperature less than about 450° C.,
wherein the integration of the tantalum oxide dielectric film forms an MIM capacitor.

30. The method of claim 29, wherein the oxygen-free liquid precursor is delivered by direct injection for use during a metalorganic chemical vapor deposition application.

31. The method of claim 29, wherein the electrodes have a nitrogen-rich stoichiometry at the interface with the tantalum oxide dielectric film relative to the stoichiometry of the bulk electrode material such that oxidation of the electrodes at the dielectric interface during subsequent processing is reduced.

32. The method of claim 26, wherein the oxygen-free liquid precursor is a 70:30 mixture by weight of ethylimino tris(diethylamino)tantalum and ethylimino ethyl(CN) tris(diethylamido)tantalum.

33. The method of claim 26, wherein the oxygen-free liquid precursor is selected from the group consisting of ethylimino tris(diethylamino)tantalum and tertiary-butylimino tris(diethylamino)tantalum.

34. The method of claim 26, wherein said annealing uses a remote plasma source with an oxygen-rich gas mixture.

* * * * *